(12) United States Patent
Nakatani et al.

(10) Patent No.: US 7,068,519 B2
(45) Date of Patent: Jun. 27, 2006

(54) PRINTED CIRCUIT BOARD AND METHOD MANUFACTURING THE SAME

(75) Inventors: Seiichi Nakatani, Hirakata (JP); Kouichi Hirano, Hirakata (JP)

(73) Assignee: Matsushita Electric Industrial Co., Ltd., Kadoma (JP)

(*) Notice: Subject to any disclaimer, the term of this patent is extended or adjusted under 35 U.S.C. 154(b) by 440 days.

(21) Appl. No.: 10/602,737

(22) Filed: Jun. 25, 2003

(65) Prior Publication Data

US 2004/0088416 A1    May 6, 2004

Related U.S. Application Data

(62) Division of application No. 09/956,551, filed on Sep. 20, 2001, now Pat. No. 6,625,037, which is a division of application No. 09/484,899, filed on Jan. 18, 2000, now Pat. No. 6,338,767, which is a division of application No. 09/196,792, filed on Nov. 20, 1998, now Pat. No. 6,038,133.

(30) Foreign Application Priority Data

Nov. 25, 1997    (JP) .................................. 9-322595

(51) Int. Cl.
*H05K 1/03* (2006.01)
*H01L 23/29* (2006.01)

(52) U.S. Cl. ............. 361/762; 361/763; 361/764; 257/701; 257/702; 257/724; 257/787

(58) Field of Classification Search ............ None
See application file for complete search history.

(56) References Cited

U.S. PATENT DOCUMENTS 4,299,873 A    11/1981    Ogihara et al.
4,417,297 A    11/1983    Oyama et al.
4,635,356 A    1/1987    Ohuchi et al.
4,800,459 A    1/1989    Takagi et al.
4,808,717 A    2/1989    Saito et al.
5,018,051 A    5/1991    Yamada et al.
5,045,381 A    9/1991    Suzuki et al.
5,096,762 A    3/1992    Yoshida et al.
5,111,278 A    5/1992    Eichelberger
5,153,987 A    10/1992    Takahashi et al.
5,161,093 A    11/1992    Gorczyca et al.
5,324,687 A    6/1994    Wojnarowski
5,401,688 A    3/1995    Yamaji et al.

(Continued)

FOREIGN PATENT DOCUMENTS

EP    0 574 207    12/1993

(Continued)

OTHER PUBLICATIONS

European Patent Office, Examination Report, Sep. 9, 2002, 5 pages.

(Continued)

*Primary Examiner*—John B. Vigushin
(74) *Attorney, Agent, or Firm*—Morrison & Foerster LLP

(57) ABSTRACT

A circuit component built-in module of the present invention includes an insulating substrate formed of a mixture comprising 70 wt % to 95 wt % of an inorganic filler and a thermosetting resin, a plurality of wiring patterns formed on at least a principal plane of the insulating substrate, a circuit component arranged in an internal portion of the insulating substrate and electrically connected to the wiring patterns, and an inner via formed in the insulating substrate for electrically connecting the plurality of wiring patterns. Thus, a highly reliable circuit component built-in module having high-density circuit components can be obtained.

16 Claims, 6 Drawing Sheets

U.S. PATENT DOCUMENTS

| | | | |
|---|---|---|---|
| 5,401,913 A | 3/1995 | Gerber et al. | |
| 5,412,538 A | 5/1995 | Kikinis et al. | |
| 5,478,007 A | * 12/1995 | Marrs | 228/180.22 |
| 5,481,795 A | 1/1996 | Hatakeyama et al. | |
| 5,484,647 A | 1/1996 | Nakatani et al. | |
| 5,497,033 A | 3/1996 | Fillion et al. | |
| 5,651,179 A | 7/1997 | Bessho et al. | |
| 5,652,042 A | 7/1997 | Kawakita et al. | |
| 5,677,045 A | 10/1997 | Nagai et al. | |
| 5,744,758 A | 4/1998 | Takenouchi et al. | |
| 5,806,177 A | 9/1998 | Hosomi et al. | |
| 5,822,856 A | 10/1998 | Bhatt et al. | |
| 5,828,126 A | 10/1998 | Thomas | |
| 5,869,886 A | * 2/1999 | Tokuno | 257/678 |
| 5,879,502 A | 3/1999 | Gustafson | |
| 5,888,627 A | 3/1999 | Nakatani | |
| 5,939,782 A | 8/1999 | Malladi | |
| 6,002,592 A | 12/1999 | Nakamura et al. | |
| 6,010,769 A | 1/2000 | Sasaoka et al. | |
| 6,038,133 A | 3/2000 | Nakatani et al. | |
| 6,143,116 A | 11/2000 | Hayashi et al. | |
| 6,252,176 B1 | 6/2001 | Kuramochi et al. | |

FOREIGN PATENT DOCUMENTS

| | | |
|---|---|---|
| EP | 0689242 A1 | 12/1995 |
| GB | 2138205 A | 10/1984 |
| JP | 60-109296 | 6/1985 |
| JP | 3-69191 | 3/1991 |
| JP | 4-18787 | 1/1992 |
| JP | 4-71297 | 3/1992 |
| JP | 4-283987 | 10/1992 |
| JP | 5-283608 | 10/1993 |
| JP | 5-299808 | 11/1993 |
| JP | 5-327228 | 12/1993 |
| JP | 5-343856 | 12/1993 |
| JP | 6-120671 | 4/1994 |
| JP | 6-200124 | 7/1994 |
| JP | 7-30060 | 1/1995 |
| JP | 8-97561 | 4/1996 |
| JP | 9-46046 | 2/1997 |
| JP | 9-249795 | 9/1997 |
| JP | 9-270482 | 10/1997 |
| JP | 9-270584 | 10/1997 |
| JP | 9-321178 | 12/1997 |
| JP | 11-26943 | 1/1999 |

OTHER PUBLICATIONS

Japanese Patent Office, Examination Report, Aug. 28, 2002, 2 pages.

Japanese Office Action dated Apr. 23, 2004, 3 pages.

* cited by examiner

PRINTED CIRCUIT BOARD AND METHOD MANUFACTURING THE SAME

This application is a division of U.S. application Ser. No. 09/956,511, filed Sep. 20, 2001, which is a division of Ser. No. 09/484,899, filed Jan. 18, 2000, now U.S. Pat. No. 6,338,767 B1, which is a division of Ser. No. 09/196,792, filed Nov. 20, 1998, now U.S. Pat. No. 6,038,133.

BACKGROUND OF THE INVENTION

1. Field of the Invention

The present invention relates to a circuit component built-in module. In particular, the present invention relates to a circuit component built-in module in which, for example, an active component is arranged in an internal portion of an insulating substrate.

2. Description of the Prior Art

Recently, with a demand for high performance and miniaturization of electronic equipment, high-performance and high-density circuit components have been increasingly desired. This leads to a demand for a circuit substrate commensurate with high-performance and high-density circuit components.

The formation of a multilayered circuit may be a solution to achieve higher-density circuit components. However, a conventional glass-epoxy substrate requires a through-hole structure to form a multilayered circuit, to that is hardly a solution for high-density mounting. Therefore, a connection method using inner via holes that can connect between wiring patterns of LSIs or circuit components in the shortest distance has been developed in various fields in order to achieve higher density packaging.

The connection method using inner via holes allows electrical connection only between the layers necessary to be connected through a connection called an inner via, so that circuit components can be mounted with high density (U.S. Pat. No. 5,481,795, U.S. Pat. No. 5,484,647, and U.S. Pat. No. 5,652,042)

However, a substrate that has been conventionally used in the inner via connection comprises a resin based material, which has low thermal conductivity. Therefore, the problem of a low thermal conductivity is posed. In a circuit component built-in module, the higher density mounting of circuit components leads to an increased demand for releasing heat that has been generated in the components. However, the conventional substrate cannot sufficiently release heat, and therefore, the reliability of the circuit component built-in module deteriorates.

SUMMARY OF THE INVENTION

It is the object of the present invention to provide a highly reliable circuit component built-in module in which circuit components are mounted with high density, and a method for producing the same.

A first circuit component built-in module of the present invention includes an insulating substrate formed of a mixture comprising 70 wt % to 95 wt % (on the basis of the mixture) of an inorganic filler and a thermosetting resin; a plurality of wiring patterns formed on at least a principal plane of the insulating substrate (one wiring pattern consists of a group of electric lines formed on the same plane); a circuit component arranged in an internal portion of the insulating substrate and electrically connected to the wiring patterns; and an inner via formed in the insulating substrate for electrically connecting the plurality of wiring patterns.

The first circuit component built-in module allows circuit components to be mounted with high density, because the inner via formed in the insulating substrate establishes inner-via-hole connection.

Furthermore, the first circuit component built-in module allows circuit components to be mounted with further higher density by mounting circuit components on the wiring patterns formed in an internal portion of the insulating substrate.

Furthermore, the first circuit component built-in module constitutes a highly reliable circuit component built-in module, because heat generated in the circuit components is released promptly by the inorganic filler.

Furthermore, the first circuit component built-in module allows the heat conductivity, the coefficient of linear expansion, the dielectric constant, the breakdown voltage or the like of the insulating substrate to be changed in accordance with the circuit components by selecting a suitable inorganic filler. When the circuit component built-in module includes a semiconductor device and a chip capacitor, noise in electric signals can be reduced by reducing the distance between the semiconductor device and the chip capacitor.

In one embodiment of the first circuit component built-in module, the wiring patterns are preferably formed on the principal plane and in an internal portion of the insulating substrate. Mounting circuit components on the wiring patterns formed in an internal portion of the insulating substrate further increases the density in the circuit components.

In one embodiment of the first circuit component built-in module, the circuit component preferably includes an active component, and the inner via is preferably formed of a conductive resin composition. A circuit component having a desired function can be formed by including an active component in the circuit components. When the inner via is formed of a conductive resin composition, the production of the circuit component built-in module can be facilitated.

In one embodiment of the first circuit component built-in module, the circuit component is preferably shielded from external air by the insulating substrate. Shielding circuit components from external air prevents the reliability of the circuit components from deteriorating, which otherwise might deteriorate due to humidity.

In one embodiment of the first circuit component built-in module, the thermosetting resin preferably comprises at least one thermosetting resin selected from the group consisting of an epoxy resin, a phenol resin and a cyanate resin. These resins are excellent in heat resistance and electrical insulation.

In one embodiment of the first circuit component built-in module, the inorganic filler comprises at least one inorganic filler selected from the group consisting of $Al_2O_3$, MgO, BN, AlN and $SiO_2$. Use of these inorganic filler provides an insulating substrate having an excellent heat dissipation. When MgO is used for the inorganic filler, the coefficient of linear expansion of the insulating substrate can be raised. When $SiO_2$ (especially, amorphous $SiO_2$) is used for the inorganic filler, the dielectric constant of the insulating substrate can be reduced. When BN is used for the inorganic filler, the coefficient of linear expansion of the insulating substrate can be reduced.

In one embodiment of the first circuit component built-in module, an average particle diameter of the inorganic filler is preferably 0.1 μm to 100 μm.

In one embodiment of the first circuit component built-in module, the wiring patterns preferably comprise at least one conductive substance selected from the group consisting of copper and a conductive resin composition. Since copper has a small electrical resistance, fine wiring patterns can be formed by using copper. Furthermore, electric lines can be formed easily by using a conductive resin composition.

In one embodiment of the first circuit component built-in module, the wiring patterns preferably comprise lead frames formed by etching or stamping. The metal lead frame has a low electric resistance. Etching allows the formation of fine wiring patterns. Stamping allows formation of the wiring patterns with simple equipment.

In one embodiment of the first circuit component built-in module, the circuit component preferably comprises at least one component selected from the group consisting of a chip resistor, a chip capacitor and a chip inductor. A chip component can be readily buried in the insulating substrate.

In one embodiment of the first circuit component built-in module, preferably, the mixture further comprises at least one additive selected from the group consisting of a dispersant, a coloring agent, a coupling agent and a releasing agent. A dispersant serves to disperse the inorganic filler in the thermosetting resin uniformly and sufficiently A coloring agent serves to color the insulating substrate, so that the heat dissipation of the circuit component built-in module can be improved. A coupling agent serves to raise the adhesion between the thermosetting resin and the inorganic filler, so that the insulating property of the insulating substrate can be improved. A releasing agent serves to improve the releasing property of the mold and the mixture, so that the productivity can be raised.

In one embodiment of the first circuit component built-in module, the insulating substrate preferably has a coefficient of linear expansion of $8\times10^{-6}/°$ C. to $20\times10^{-6}/°$ C. and a heat conductivity of 1 w/mK to 10 w/mK. A heat conductivity close to that of a ceramic substrate can be obtained, and a substrate having high heat dissipation can be obtained.

In one embodiment of the first circuit component built-in module, the active component preferably comprises a semiconductor bare chip, and the semiconductor bare chip is preferably flip-chip bonded onto the wiring pattern. The flip chip bonding of the semiconductor bare chip allows high density mounting of semiconductor devices.

In one embodiment of the first circuit component built-in module, the conductive resin composition preferably comprises, as a conductive component, metal particles of at least one metal selected from the group consisting of gold, silver, copper and nickel, and an epoxy resin as a resin component. The above-listed metals have low electric resistances, and an epoxy resin is excellent in heat resistance and electric insulation.

A first method for producing a circuit component built-in module includes the following steps: processing a mixture comprising 70 wt % to 95 wt % (on the basis of the mixture) of an inorganic filler and an uncured thermosetting resin into a first sheet having a through-hole; filling the through-hole with a thermosetting conductive substance so as to form a second sheet having the through-hole filled with the thermosetting conductive substance; mounting a circuit component on a wiring pattern portion in a first film; positioning and superimposing the second sheet on the side of the first film where the circuit component is mounted, and superimposing a second film having a wiring pattern portion on the second sheet, thereby forming a third sheet in which the circuit component is buried; and heating the third sheet so as to form a fourth sheet in which the thermosetting resin and the conductive substance are cured.

According to the first method, the circuit component built-in module of the present invention can be produced easily.

A second method for producing a circuit component built-in module of the present invention is directed to a method for producing a circuit component built-in module having a multilayered structure. The second method includes the following steps: processing a mixture comprising 70 wt % to 95 wt % (on the basis of the mixture) of an inorganic filler and an uncured thermosetting resin into a first sheet having a through-hole; filling the through-hole with a thermosetting conductive substance so as to form a second sheet having the through-hole filled with the thermosetting conductive substance; forming a wiring pattern on a principal plane of a release film and mounting a circuit component on the wiring pattern; positioning and superimposing the second sheet on the principal plane of the release film, and pressing the second sheet together with the release film provided with the circuit component, thereby forming a third sheet in which the circuit component is buried; peeling the release film from the third sheet so as to form a fourth sheet; and positioning and superimposing a plurality of sheets produced in the same manner as the fourth sheet on one another with a film including a wiring pattern portion on top of the plurality of sheets, and pressing and heating the plurality of sheets and the film, thereby forming a fifth sheet having a multilayered structure in which the thermosetting resin and the conductive substance are cured.

According to the second method, the circuit component built-in module having a multilayered structure of the present invention can be produced easily.

In one embodiment of the first and second methods for producing a circuit component built-in module, the circuit component preferably comprises an active component, and the conductive substance comprises a conductive resin composition. A circuit component having a desired function can be formed by including an active component in the circuit components. Furthermore, when the conductive substance comprises a conductive resin composition, it is easy to fill a through-hole with the conductive substance and to cure the conductive substance. Therefore, the production is facilitated.

In one embodiment of the first and second methods for producing a circuit component built-in module, the first and second films are formed of copper foils, and the method further comprises the step of removing the copper foil in a portion other than the wiring pattern portions so as to form wiring patterns after the step of forming a sheet in which the thermosetting resin and the conductive substance are cured. This step facilitates the formation of the wiring pattern on the principal plane of the insulating substrate In one embodiment of the first and second methods for producing a circuit component built-in module, the first and second films are formed of release films on one principal plane of which wiring patterns are formed, and the method further comprises the step of peeling the release films from the sheet, after the step of forming a sheet having the thermosetting resin and the conductive substance cured. This step facilitates the formation of the wiring patterns on the principal plane of the insulating substrate.

In one embodiment of the first and second methods for producing a circuit component built-in module, the method further includes the step of injecting a sealing resin between the copper foil or the wiring pattern and the circuit component after the step of mounting the circuit component in the copper foil or the wiring pattern. This step prevents gaps from being formed between the circuit component and the wiring pattern, and strengthens the connection between the circuit component and the wiring pattern.

In one embodiment of the first and second methods for producing a circuit component built-in module, the thermosetting resin and the conductive substance are preferably heated at 150° C. to 260° C. for curing. The heating in this range of temperatures can cure the thermosetting resin without causing damage to the circuit component.

In one embodiment of the first and second methods for producing a circuit component built-in module, the thermosetting resin and the conductive substance are preferably pressed at a pressure of 10 kg/cm$^2$ to 200 kg/cm$^2$ while being heated for curing. Pressing while heating provides a circuit component built-in module having an excellent mechanical strength.

In one embodiment of the first and second methods for producing a circuit component built-in module, the step of forming the first sheet further comprises the step of heating the sheet mixture at a temperature below a cure temperature (e.g., a temperature lower than a cure starting temperature) of the thermosetting resin, thereby eliminating the adhesion of the sheet mixture after the step of forming the mixture into the sheet. A subsequent process can be facilitated by eliminating the adhesion of the sheet mixture.

In one embodiment of the first and second methods for producing a circuit component built-in module, the step of forming the third sheet by burying the circuit component in the second sheet is preferably performed at a temperature below a cure temperature of the thermosetting resin. When the step is performed at a temperature below a cure temperature of the thermosetting resin, the thermosetting resin can be softened without being cured. This embodiment makes it easy to bury the circuit component in the second sheet, and also makes it to provide a smooth surface to the circuit component built-in module.

In one embodiment of the first and second methods for producing a circuit component built-in module, the step of mounting the circuit component on the wiring pattern comprises the step of electrically and mechanically connecting the circuit component and the wiring pattern with solder. This embodiment prevents poor connection between the circuit component and the wiring pattern due to heating that is performed to cure the thermosetting resin.

In one embodiment of the first and second methods for producing a circuit component built-in module, the step of mounting the active component on the wiring pattern comprises the step of electrically connecting a gold bump of the active component and the wiring pattern with a conductive adhesive. The use of a conductive adhesive prevents poor connection or dislocation of components from occurring at a subsequent step of heating.

As described above, the circuit component built-in module of the present invention employs the insulating substrate comprising a mixture of an inorganic filler and a thermosetting resin and also utilizes the inner-via-hole connection. This makes it possible to mount circuit components with high density and also allows high heat dissipation. Therefore, the present invention provides a highly reliable circuit component built-in module with circuit components mounted with high density.

Furthermore, it is possible to mount circuit components with higher density by making the circuit component built-in module of the present invention in a multilayered structure.

Furthermore, in the circuit component built-in module of the present invention, the heat conductivity, the coefficient of linear expansion, the dielectric constant or the like of the insulating substrate can be controlled by selecting a suitable inorganic filler. Therefore, in the circuit component built-in module of the present invention, it is possible to equalize substantially the coefficient of linear expansion of the insulating substrate with that of the semiconductor device, so that the present invention is preferably used as a circuit component built-in module in which a semiconductor device is built-in. Furthermore, the heat conductivity of the insulating substrate can be improved so that the present invention is preferably used as a circuit component built-in module in which a component that requires heat dissipation such as a semiconductor device is built-in. Furthermore, it is possible to reduce the dielectric constant of the insulating substrate, so that the present invention is preferably used as a circuit component built-in module for high frequency circuits.

According to the methods for producing a circuit component built-in module of the present invention, the above-described circuit component built-in module can be produced easily.

Furthermore, according to the methods for producing a circuit component built-in module of the present invention, wiring patterns can be buried in the insulating substrate by using a release film provided with the wiring patterns. Therefore, a circuit component built-in module having a smooth surface can be obtained. Thus, when additional circuit components are mounted on the wiring patterns on the surface, a circuit component built-in module having circuit components mounted with higher density can be obtained.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of embodiments with reference to the accompanying drawings.

Embodiment 1

Figure 1:
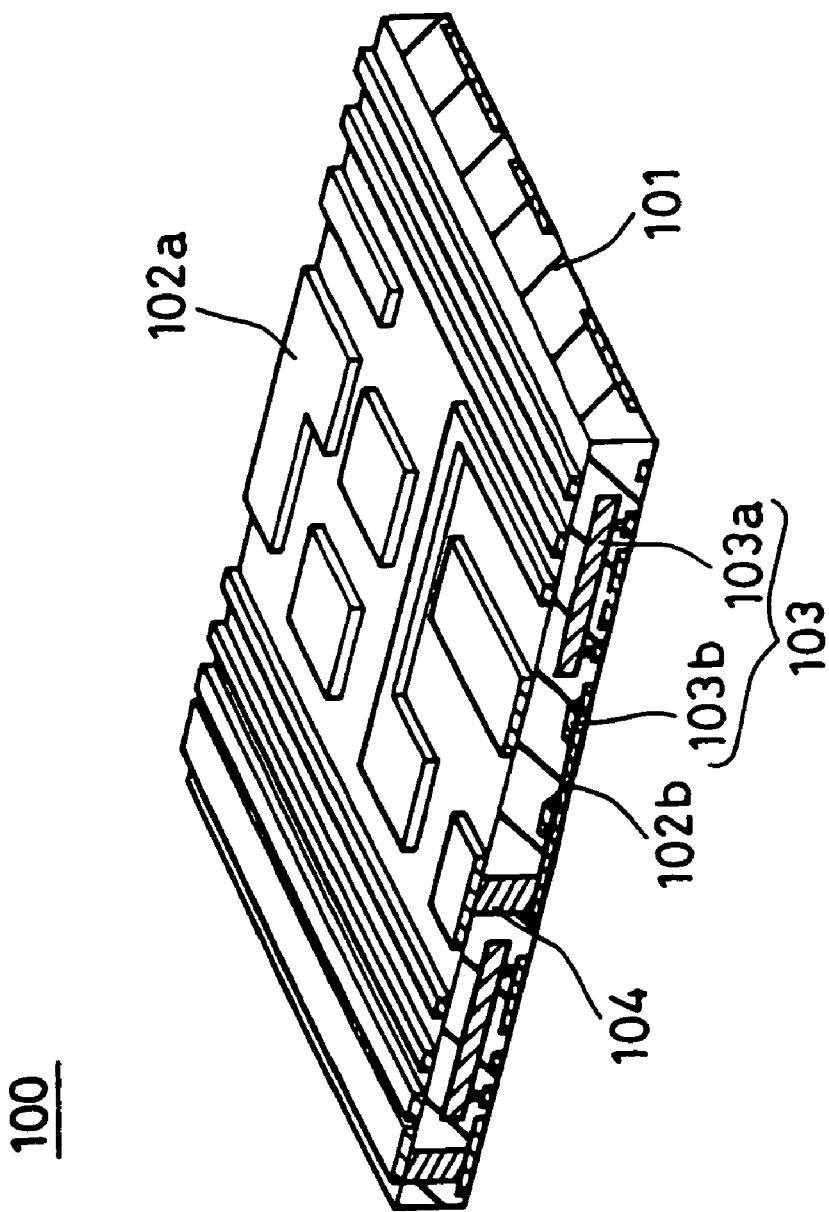
FIG. 1 is a perspective cross-sectional view showing one embodiment of a circuit component built-in module of the present invention.

One example of a circuit component built-in module of the present invention will be described with reference to FIG. 1 of Embodiment 1. FIG. 1 is a perspective cross-sectional view of a circuit component built-in module 100 of this embodiment.

Referring to FIG. 1, the circuit component built-in module 100 in Embodiment 1 includes an insulating substrate 101, wiring patterns 102a and 102b formed on one principal plane and the other principal plane of the insulating substrate 101, circuit components 103 connected to the wiring pattern 102b and arranged in the insulating substrate 101, and an inner via 104 for electric connection between the wiring patterns 102a and 102b.

The insulating substrate 101 is formed of a mixture comprising an inorganic filler and a thermosetting resin. For the inorganic filler, for example, $Al_2O_3$, MgO, BN, AlN or $SiO_2$ can be used. The inorganic filler is preferably contained in an amount of 70 wt % to 95 wt % on the basis of the mixture. The average particle diameter of the inorganic filler is preferably 0.1 μm to 100 μm. Preferable examples of the thermosetting resin include an epoxy resin, a phenol resin or a cyanate resin, which are highly resistant against heat. An epoxy resin is most preferable because of its especially high heat resistance. The mixture may further comprise a dispersant, a coloring agent, a coupling agent or a releasing agent.

The wiring patterns 102a and 102b are formed of an electrically conductive substance, such as a copper foil or a conductive resin composition. When a copper foil is used for the wiring pattern, for example, a copper foil with a thickness of about 18 μm to 35 μm produced by electrolytic plating can be used. The surface of the copper foil that is in contact with the insulating substrate 101 is preferably made rough so that the adhesion with the insulating substrate 101 can be improved. Furthermore, the copper foil whose surface has been subjected to a coupling treatment or plated with tin, zinc or nickel can be used for better adhesion and oxidation resistance. Furthermore, metal lead frame produced by etching or stamping can be used for the wiring patterns 102a and 102b.

The circuit components 103 include, for example, an active component 103a and a passive component 103b. A semiconductor device such as a transistor, an IC, and an LSI can be used for the active component 103a. The semiconductor device may be a semiconductor bare chip. A chip resistor, a chip capacitor or a chip inductor can be used for the passive component 103b. The circuit components 103 may not include the passive component 103b.

The active component 103a is connected to the wiring pattern 102a by flip chip bonding. The semiconductor bare chips are flip-chip bonded so that circuit components can be mounted with high density.

The inner via 104 is formed of a conductive substance. For example, a conductive resin composition comprising metal particles and a thermosetting resin can be used for the inner via 104. Examples of the metal particles include gold, silver, copper and nickel. Gold, silver, copper and nickel are preferable because of their high conductivity. Among them, copper is most preferable because of its especially high conductivity and small migration. As for the thermosetting resin, for example, an epoxy resin, a phenol resin or a cyanate resin can be used. An epoxy resin is most preferable because of its high heat resistance.

In the circuit component built-in module 100 in Embodiment 1, the wiring patterns 102a and 102b are connected by the inner via 104 filling a through-hole in the insulating substrate 101. As a result, in the circuit component built-in module 100, the circuit components 103 can be mounted with high density.

Furthermore, in the circuit component built-in module 100, the inorganic filler contained in the insulating substrate 101 swiftly conducts the heat generated in the circuit components. Therefore, a highly reliable circuit component built-in module can be obtained.

Furthermore, in the circuit component built-in module 100, the coefficient of linear expansion, the heat conductivity, and the dielectric constant of the insulating substrate 101 can be controlled easily by selecting a suitable organic filler for the insulating substrate 101. A coefficient of linear expansion of the insulating substrate 101 substantially equal to that of the semiconductor device prevents cracks or the like from occurring due to a temperature change. As a result, a reliable circuit component built-in module can be obtained. An improvement in the heat conductivity of the insulating substrate 101 allows a reliable circuit component built-in module to be produced even if the circuit components are mounted with high density. A low dielectric constant of the insulating substrate 101 allows a module for high frequency circuit with little dielectric loss to be produced.

Furthermore, in the circuit component built-in module 100, the insulating substrate 101 can shield the circuit components 103 from the external air, thus preventing deterioration of reliability due to humidity.

Furthermore, in the circuit component built-in module 100 of the present invention, the insulating substrate 101 is formed of a mixture of an inorganic filler and a thermosetting resin, so that the substrate 101 can be produced easily without being sintered at a high temperature unlike a ceramic substrate.

In the circuit component built-in module 100 shown in FIG. 1, the wiring pattern 102a is not buried in the insulating substrate 101. However, the wiring pattern 102a may be buried in the insulating substrate 101 (refer to FIG. 3(h)).

In the circuit component built-in module 100 shown in FIG. 1, no circuit component is mounded on the wiring pattern 102a. However, a circuit component may be mounded on the wiring pattern 102a, and the circuit component built-in module may be molded with resin (the same is applied to the following embodiments). The circuit components can be mounted with a higher density by mounting circuit components on the wiring pattern 102a.

Embodiment 2

One embodiment of a method for producing the circuit component built-in module shown in FIG. 1 will be described with reference to FIGS. 2(a) to 2(h) of Embodiment 2. The materials and the circuit components used in Embodiment 2 are the same as those described in Embodiment 1.

FIGS. 2(a) to 2(h) are cross-sectional views showing a process sequence in one embodiment of a method for producing the circuit component built-in module.

Figure 2:
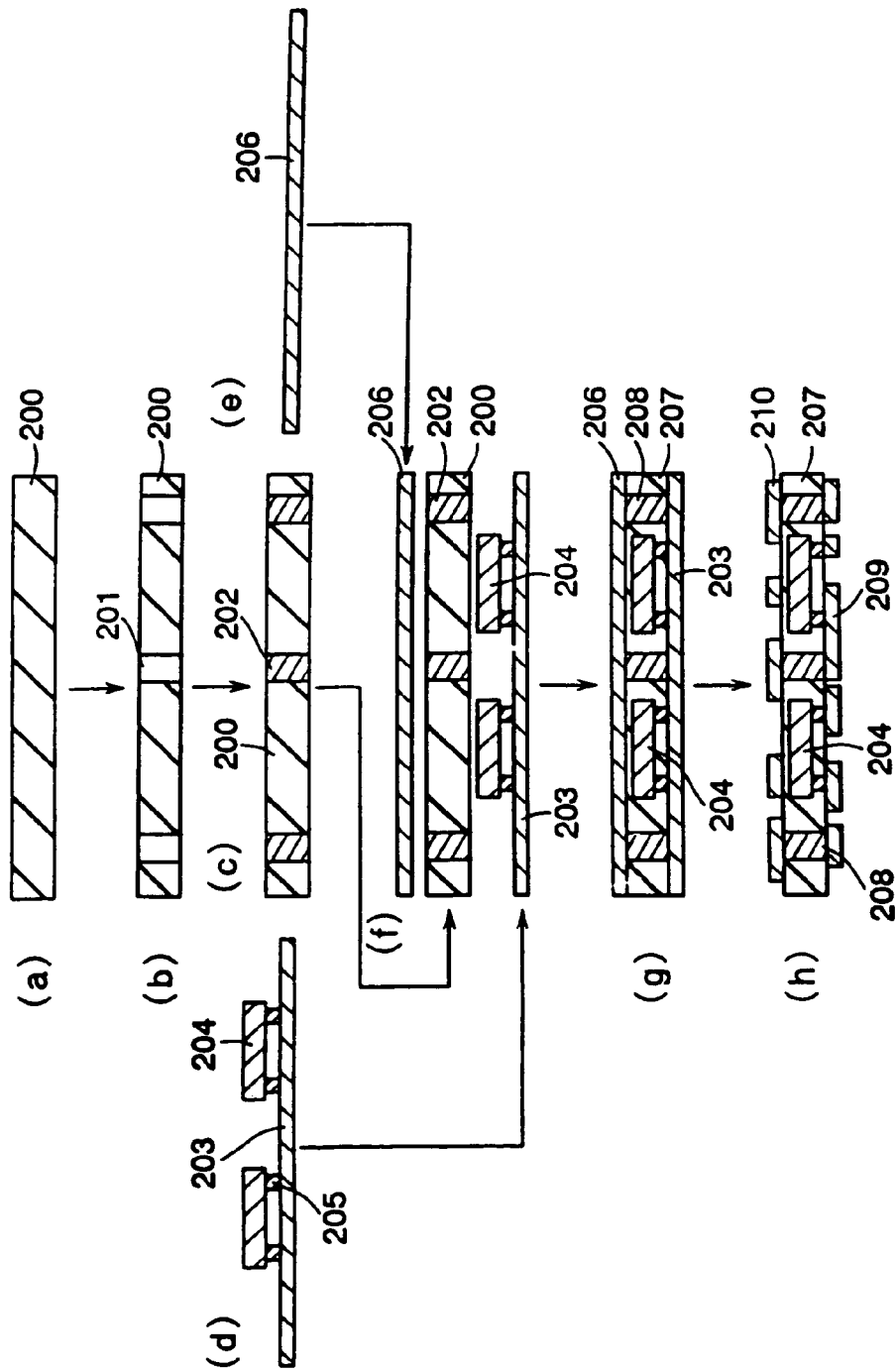
FIGS. 2(a) to 2(h) are views showing a process sequence in an embodiment of a method for producing a circuit component built-in module of the present invention.

First, as shown in FIG. 2(a), a mixture of an inorganic filler and a thermosetting resin is processed so as to form a mixture 200 in the form of a sheet. An inorganic filler and an uncured thermosetting resin are mixed so as to form a paste mixture. The paste mixture is molded in a predetermined thickness so as to form the mixture 200 in the form of a sheet (hereinafter, referred to as "sheet mixture").

The sheet mixture 200 may be heated at a temperature below the curing temperature of the thermosetting resin. The heat treatment allows the adhesion of the mixture 200 to be eliminated while maintaining the flexibility, thereby facilitating the subsequent processes. In addition, for a mixture comprising a thermosetting resin dissolved in a solvent, a heat treatment serves to remove the solvent partially.

Thereafter, as shown in FIG. 2(b), a through-hole 201 is formed in a desired position in the mixture 200 so as to form a sheet having the throughhole 201. The through-hole 201 can be formed by, for example, laser processing or processing with a drill or a mold. Laser processing is preferable because it allows formation of the through-hole 201 in a fine pitch and generates no debris. In laser processing, carbon dioxide gas laser or excimer laser is preferably used to facilitate the processing. The throughhole 201 may be formed simultaneously when the paste mixture is molded into the sheet mixture 200.

Thereafter, as shown in FIG. 2(c), a sheet having the through-hole 201 filled with a conductive resin composition 202 is formed by filling the through-hole 201 with the conductive resin composition 202.

In parallel to the processes shown in FIGS. 2(a) to 2(c), as shown in FIG. 2(d), a circuit component 204 is flip-chip bonded to a copper foil. The circuit component 204 is electrically connected to the copper foil 203 via a conductive adhesive 205. As for the conductive adhesive 205, for example, a mixture of a thermosetting resin and gold, silver, copper, or a silver-palladium alloy can be used. Instead of the conductive adhesive 205, a bump produced by a gold wire bonding or a solder bump may be formed on the side of the circuit component 204 beforehand, and the gold or the solder may be dissolved by a heat treatment so that the circuit component 204 can be mounted on the copper foil 203. Furthermore, the solder bump can be used together with the conductive adhesive.

A sealing resin may be injected between the copper foil 203 and the circuit component 204 mounted on the copper foil 203 (also in the following embodiments, a sealing resin may be injected between a circuit component and a copper foil or a circuit component and a wiring pattern). The injection of a sealing resin prevents the formation of gaps between the semiconductor device and the wiring pattern when burying the semiconductor device in the sheet in a subsequent process. An underfill resin, which is used for general flip chip bonding, can be used for the sealing resin.

In parallel to the processes shown in FIGS. 2(a) to 2(c), a copper foil 206 is formed, as shown in FIG. 2(e).

Thereafter, as shown in FIG. 2(f), the sheet of FIG. 2(c) is sandwiched between the copper foil 203 provided with the circuit component 204 and the copper foil 206 in a suitable position.

Then, as shown in FIG. 2(g), the sheet together with the copper foils 203 and 206 are pressed, so that the circuit component 204 is buried in the sheet. Then, the sheet is heated so that the thermosetting resin in the mixture 200 and the conductive resin composition 202 is cured. Thus, the sheet in which the circuit component 204 is buried is formed. The heating is performed at a temperature equal to or higher than a temperature at which the thermosetting resin in the mixture 200 and the conductive resin composition 202 is cured (e.g., 150° C. to 260° C.). The mixture 200 serves as an insulating substrate 207, and the conductive resin composition 202 serves as an inner via 208. This process allows the copper foils 203 and 206, the circuit component 204 and the insulating substrate 207 to strongly adhere to each other mechanically. The inner via 208 electrically connects the copper foils 203 and 206. The mechanical strength of the circuit component module can be improved by applying a pressure of 10 kg/cm$^2$ to 200 kg/cm$^2$ while heating to cure the thermosetting resin in the mixture 200 and the conductive resin composition 202 (the same can apply in the following embodiments).

Thereafter, as shown in FIG. 2(h), the copper foils 203 and 206 are processed into wiring patterns 209 and 210.

Thus, the circuit component built-in module as described in Embodiment 1 can be formed. The above-described method allows the circuit component built-in module as described in Embodiment 1 to be produced easily.

In Embodiment 2, the conductive resin composition 202 is used as a conductive substance with which the through-hole 201 is filled. However, the conductive substance is not limited thereto, and any thermosetting conductive substance can be used, which also applies to the following embodiments.

Embodiment 3

Another embodiment of a method for producing the circuit component built-in module shown in FIG. 1 will be described with reference to FIGS. 3(a) to 3(h) of Embodiment 3. The materials and the circuit components used in Embodiment 3 are the same as those described in Embodiment 1.

FIGS. 3(a) to 3(h) are cross-sectional views showing a process sequence for producing a circuit component built-in module in Embodiment 3.

Figure 3:
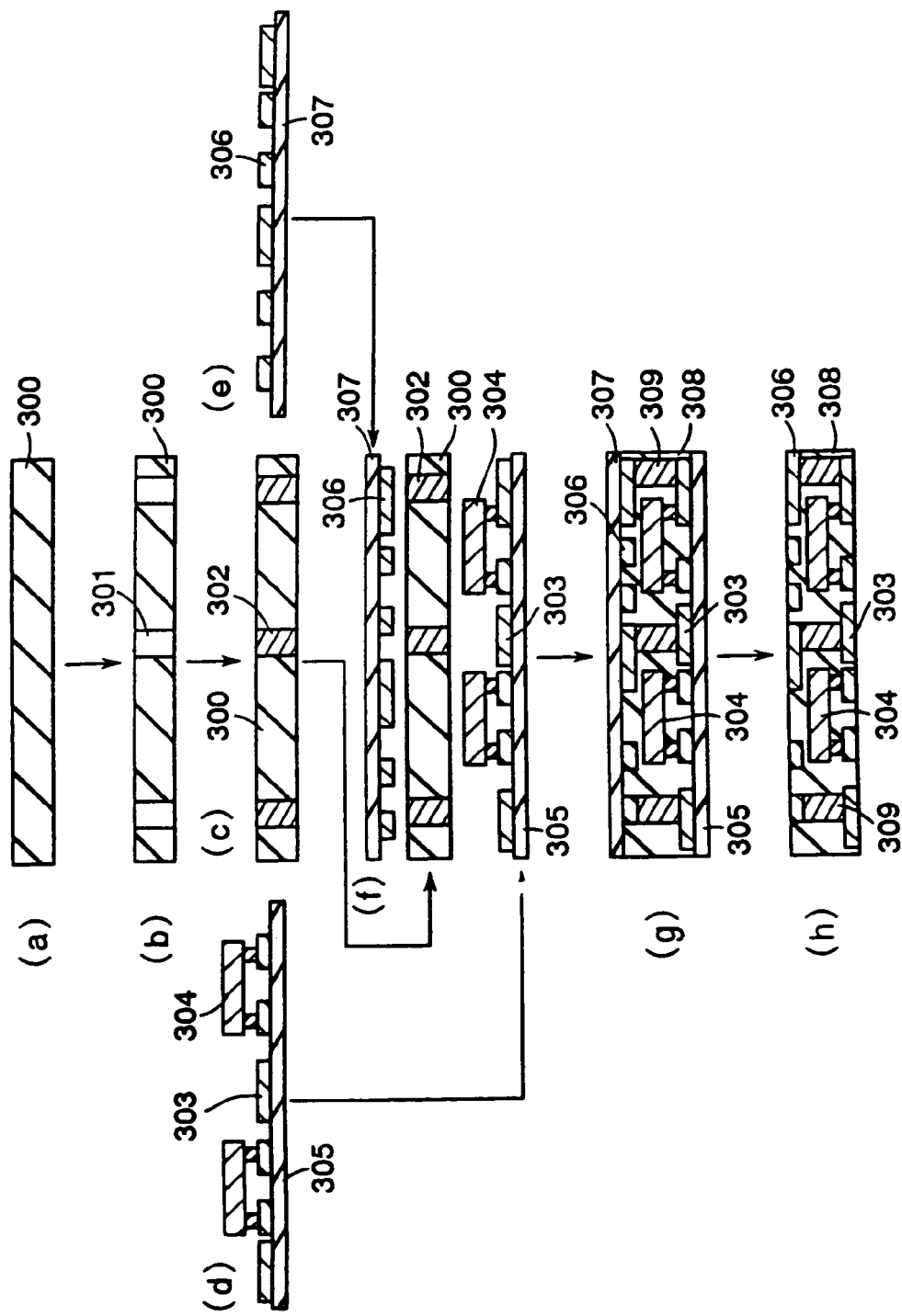
FIGS. 3(a) to 3(h) are views showing a process sequence in an embodiment of a method for producing a circuit component built-in module of the present invention.

First, as shown in FIG. 3(a), a mixture comprising an inorganic filler and a thermosetting resin is processed into a sheet mixture 300. Since this process is the same as that described with reference to FIG. 2(a), it will not be described further herein.

Thereafter, as shown in FIG. 3(b), a through-hole 301 is formed in a desired position of the mixture 300. Since this process is the same as that described with reference to FIG. 2(b), it will not be described further herein.

Then, as shown in FIG. 3(c), the through-hole 301 is filled with a conductive resin composition 302, so as to form a sheet with the through-hole 301 filled with the conductive resin composition 302.

In parallel to the processes shown in FIGS. 3(a) to 3(c), as shown in FIG. 3(d), a wiring pattern 303 is formed on a release film 305, and a circuit component 304 is mounted on the wiring pattern 303. The circuit component 304 is mounted in the same manner as described with reference to FIG. 2(d), so that it will not be described further herein. For example, polyethylene terephthalate or polyphenylene sulfide can be used for the release film 305. The wiring pattern 303 can be formed by attaching a copper foil to the release film 305 and then performing photolithography and etching. Instead, a metal lead frame that is formed by etching or stamping can be used for the wiring pattern 303.

In parallel to the processes shown in FIGS. 3(a) to 3(c), as shown in FIG. 3(e), a wiring pattern 306 is formed on a release film 307. The wiring pattern 306 can be formed in the same manner as the wiring pattern 303.

Thereafter, as shown in FIG. 3(f), the sheet of FIG. 2(c) is sandwiched between the release films 305 and 307 in a suitable position so that the wiring patterns 303 and 306 and the conductive substance 302 are connected in a desired portion.

Then, as shown in FIG. 3(g), the sheet together with the release films 305 and 307 is pressed and heated so that the thermosetting resin in the mixture 300 and the conductive resin composition 302 is cured. Thus, the sheet in which the circuit component 304 and the wiring patterns 303 and 306 are buried is formed. The heating is performed at a temperature equal to or higher than a temperature at which the thermosetting resin in the mixture 300 and the conductive resin composition 302 is cured (e.g., 150° C. to 260° C.).

The mixture 300 serves as an insulating substrate 308, and the conductive resin composition 302 serves as an inner via 309. The inner via 309 electrically connects the wiring patterns 303 and 306.

Thereafter, as shown in 3(h), the release film 305 and 307 are peeled from the sheet of FIG. 3(g).

Thus, the circuit component built-in module as described in Embodiment 1 can be produced. The above-described method makes it easy to produce the circuit component built-in module as described in Embodiment 1.

In this method, the release film 307 on which the wiring pattern 306 has been formed earlier is used, so that the obtained circuit component built-in module has a smooth surface as a result of burying the wiring pattern 306 in the insulating substrate 308. The smoothness of the surface makes it possible to mount the components on the wiring pattern 306 with high density and thus to achieve higher density circuit components.

Embodiment 4

Figure 4:
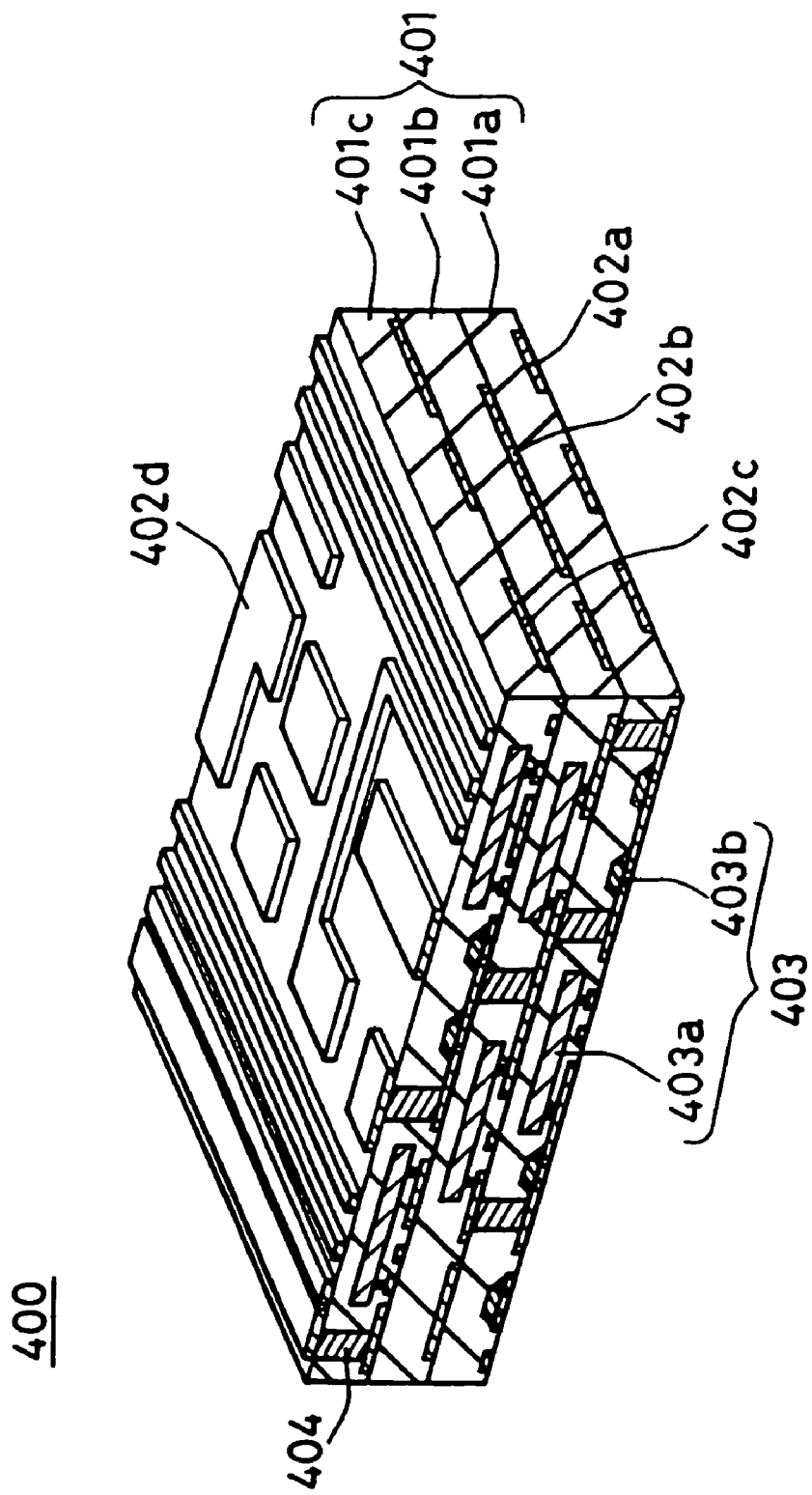
FIG. 4 is a perspective cross-sectional view showing an embodiment of a circuit component built-in module of the present invention.

One embodiment of a circuit component built-in module having a multilayered structure of the present invention will be described with reference to FIG. 4 of Embodiment 4. FIG. 4 is a perspective cross-sectional view of a circuit component built-in module 400 of this embodiment.

Referring to FIG. 4, the circuit component built-in module 400 in Embodiment 4 includes an insulating substrate 401 comprising insulating substrates 401a, 401b and 401c, wiring patterns 402a, 402b, 402c and 402d formed on one principal plane and in the internal portion of the insulating substrate 401, a circuit component 403 arranged in the internal portion of the insulating substrate 401 and connected to the wiring patterns 402a, 402b or 402c, and an inner via 404 for electrical connection between the wiring patterns 402a, 402b, 402c and 402d.

The insulating substrates 401a, 401b and 401c are formed of a mixture comprising an inorganic filler and a thermosetting resin. For example, $Al_2O_3$, MgO, BN, AlN or $SiO_2$ can be used for the inorganic filler. The inorganic filler is preferably contained in an amount of 70 wt % to 95 wt % on the basis of the mixture. The average particle diameter of the inorganic filler is preferably 0.1 μm to 100 μm. Preferable examples of the thermosetting resin include an epoxy resin, a phenol resin, or a cyanate resin, which are highly resistant against heat. An epoxy resin is most preferable because of its especially high heat resistance. The mixture may further comprise a dispersant, a coloring agent, a coupling agent or a releasing agent.

The wiring patterns 402a, 402b, 402c and 402d are the same as the wiring patterns 102a and 102b, which are described in Embodiment 1, and they will not be described further herein.

The circuit component 403 includes, for example, an active component 403a and a passive component 403b. A semiconductor device such as a transistor, an IC, and an LSI can be used for the active component 403a. The semiconductor device may be a semiconductor bare chip. A chip resistor, a chip capacitor or a chip inductor can be used for the passive component 403b. The circuit component 403 may not include the passive component 403b.

The active component 403a is connected to the wiring patterns 402a, 402b, and 403c, for example, by flip chip bonding. The semiconductor bare chips may be flip-chip bonded so that circuit components can be mounted with high density.

The inner via 404 is formed of a conductive substance. For example, a conductive resin composition comprising metal particles and a thermosetting resin can be used for the inner via 404. Examples of the metal particles include gold, silver, copper and nickel. Gold, silver, copper and nickel are preferable because of their high conductivity. Among them, copper is most preferable because of its especially high conductivity and small migration. As for the thermosetting resin, for example, an epoxy resin, a phenol resin or a cyanate resin can be used. An epoxy resin is most preferable because of its high heat resistance.

In the circuit component built-in module 400 shown in FIG. 4, the wiring pattern 402d is not buried in the insulating substrate 401c. However, the wiring pattern 402d may be buried in the insulating substrate 401c (see to FIG. 6(g)).

FIG. 4 shows the circuit component built-in module 400 having a three layered structure, a structure having any number of layers can be formed depending on the design, and the same applies to the following embodiments.

Embodiment 5

Another embodiment of a method for producing the circuit component built-in module of Embodiment 4 will be described with reference to FIGS. 5(a) to 5(h) of Embodiment 5. The material and the circuit components used in Embodiment 5 are the same as those described in Embodiment 4.

FIGS. 5(a) to 5(h) are cross-sectional views showing a process sequence for producing a circuit component built-in module in this embodiment.

Figure 5:
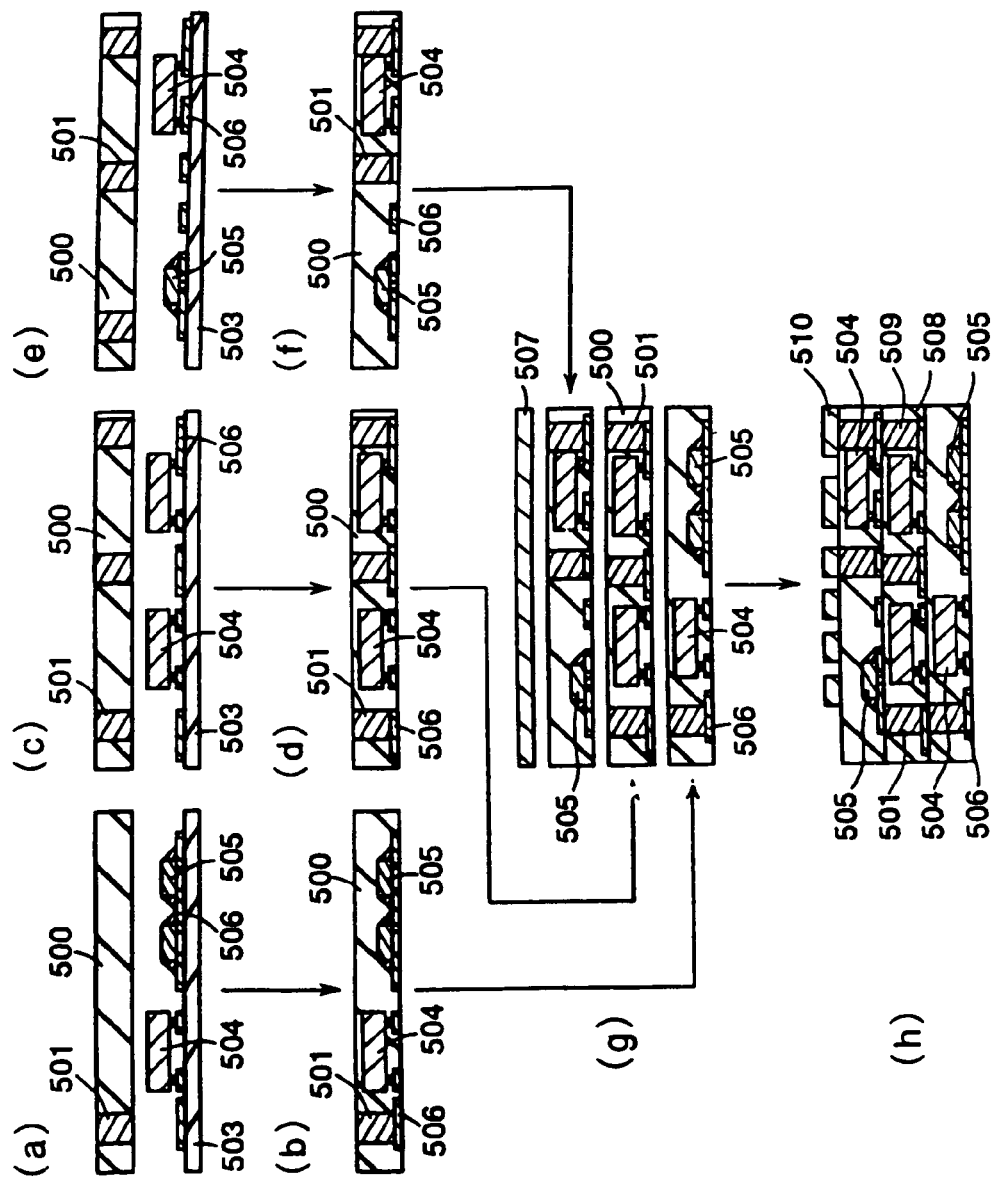
FIGS. 5(a) to 5(h) are views showing a process sequence in an embodiment of a method for producing a circuit component built-in module of the present invention.

First, as shown in FIG. 5(a), a mixture comprising an inorganic filler and a thermosetting resin is processed into a sheet mixture 500. A through-hole is filled with a conductive resin composition 501, so as to form a sheet with the through-hole filled with the conductive resin composition 501. Since this process is the same as that described with reference to FIGS. 2(a) to 2(c), it will not be described further herein.

On the other hand, a wiring pattern 506 is formed on a release film 503, and an active component 504 and a passive component 505 are mounted on the wiring pattern 506. This process is the same as that described with reference to FIG. 3(d), so that it will not be described further herein.

Thereafter, the sheet of FIG. 5(a) is positioned and superimposed on the release film 503, and they are pressed. Then, the release film 503 is peeled off, so that the sheet in which the wiring pattern 506, the active component 504 and the passive component 505 are buried is formed, as shown in FIG. 5(b).

In parallel to the processes of FIGS. 5(a) and 5(b), a plurality of sheets in which the wiring pattern 506 and the circuit components are buried are formed in the same manner as those shown in FIGS. 5(a) and 5(b) (see to FIGS. 5(c) and 5(d), and FIGS. 5(e) and 5(f)). The wiring pattern 506 and the circuit components are different from layer to layer in accordance with the design.

Thereafter, as shown in FIG. 5(g), the sheet of FIG. 5(d) is sandwiched between the sheets of FIGS. 5(b) and 5(f) in a suitable position. Then, a copper foil 507 is superimposed on a principal plane of the sheet of FIG. 5(f) in which the wiring pattern is not formed.

Thereafter, the sheets and the copper foil 507 are positioned and placed on one another in the process shown in FIG. 5(g), pressed and heated, so that a sheet having a multilayered structure can be formed, as shown in FIG. 5(h). The heating is performed at a temperature equal to or higher than a temperature at which the thermosetting resin in the mixture 500 and the conductive resin composition 501 is cured (e.g., 150° C. to 260° C.). The mixture 500 serves as an insulating substrate 508, and the conductive resin composition 501 serves as an inner via 509. This process allows the circuit components 504 and 505, the copper foil 507 and the insulating substrate 508 to strongly adhere mechanically. The inner via 509 electrically connects the wiring pattern 506 and the copper foil 507. Then, the copper foil 507 is processed into a wiring pattern 510.

Thus, a circuit component built-in module having a multilayered structure can be formed. The above-described method allows a circuit component built-in module having a multilayered structure to be produced easily.

Embodiment 6

Another embodiment of a method for producing the circuit component built-in module of Embodiment 4 will be described with reference to FIGS. 6(a) to 6(g) of Embodiment 6. The material and the circuit components used in Embodiment 6 are the same as those described in Embodiment 4.

FIGS. 6(a) to 6(g) are cross-sectional views showing a process sequence for producing a circuit component built-in module in this embodiment.

Figure 6:
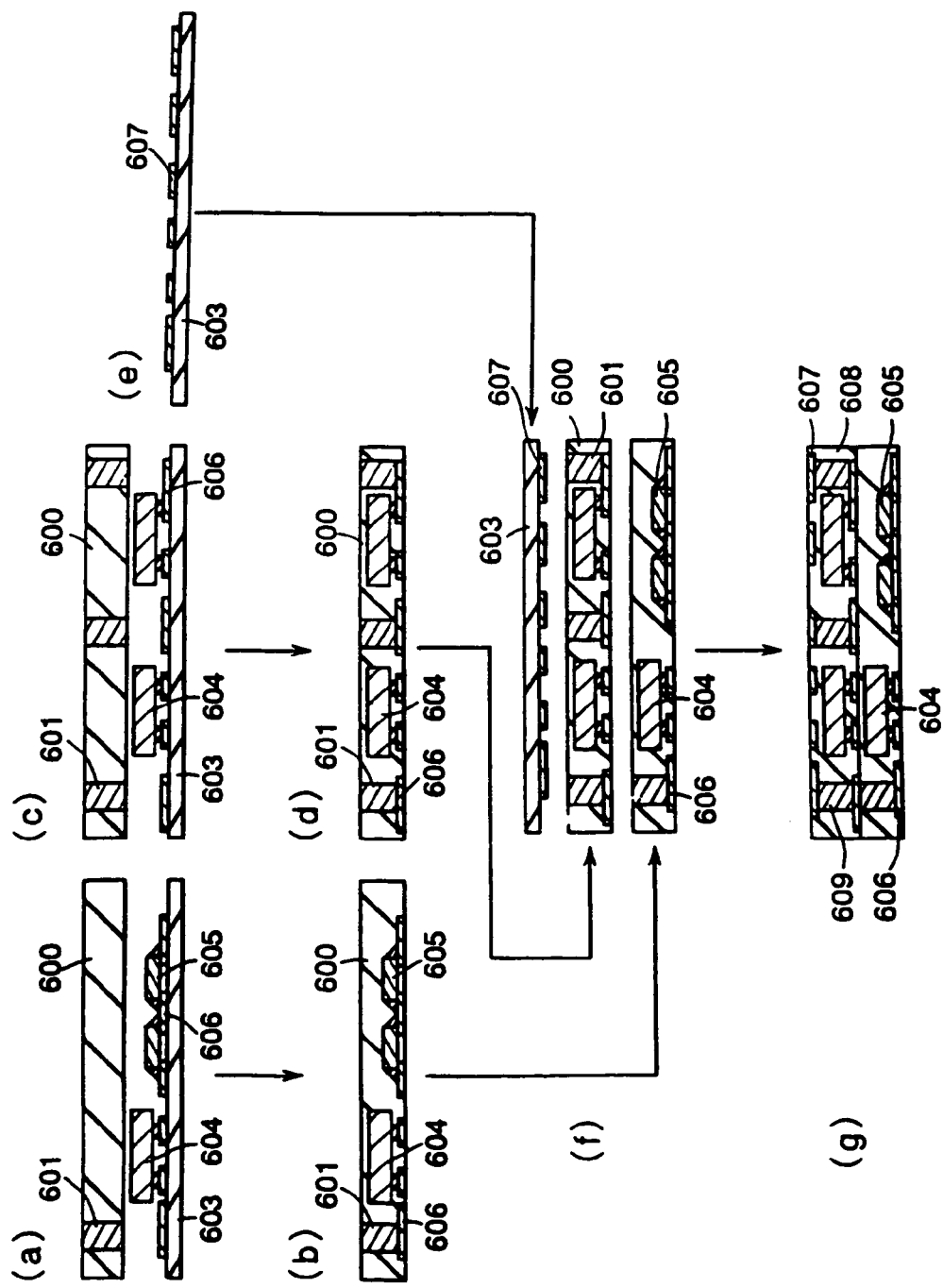
FIGS. 6(a) to 6(g) are views showing a process sequence in an embodiment of a method for producing a circuit component built-in module of the present invention.

First, as shown in FIG. 6(a), a mixture comprising an inorganic filler and a thermosetting resin is processed into a sheet mixture 600. A throughhole is filled with a conductive resin composition 601, so as to form a sheet with the through-hole filled with the conductive resin composition 601. Since this process is the same as that described with reference to FIGS. 2(a) to 2(c), it will not be described further herein.

On the other hand, a wiring pattern 606 is formed on a release film 603, and an active component 604 and a passive component 605 are mounted on the wiring pattern 606. This process is the same as that described with reference to FIG. 3(d), so that it will not be described further herein.

Thereafter, the sheet of FIG. 6(a) is positioned and superimposed on the release film 603, and they are pressed. Then, the release film 603 is peeled off, so that the sheet in which the wiring pattern 606, the active component 604 and the passive component 605 are buried is formed, as shown in FIG. 6(b).

In parallel to the processes of FIGS. 6(a) and 6(b), a plurality of sheets in which the wiring pattern 606 and the circuit components are buried are formed in the same manner as those shown in FIGS. 6(a) and 6(b) (refer to FIGS. 6(c) and 6(d)). The wiring pattern 606 and the circuit components are different from layer to layer in accordance with the design.

In parallel to the processes of FIGS. 6(a) and 6(b), as shown in FIG. 6(e), a wiring pattern 607 is formed on the release film 603.

Thereafter, as shown in FIG. 6(f), the sheet of FIG. 6(d) is positioned and superimposed on the sheet of FIG. 6(b). Then, the release film 603 of FIG. 6(e) is superimposed on a principal plane of the sheet of FIG. 6(d) on which the wiring pattern 606 is not formed so that the wiring pattern 607 on the release film 603 faces inwards Thereafter, the sheets and the release film 603 are positioned and attached to each other in the process shown in FIG. 6(f), pressed and heated, so that a sheet having a multilayered structure can be formed, as shown in FIG. 6(g). The heating is performed at a temperature equal to or higher than a temperature at which the thermosetting resin in the mixture 600 and the conductive resin composition 601 is cured (e.g., 150° C. to 260° C.). The mixture 600 serves as an insulating substrate 608, and the conductive resin composition 601 serves as an inner via 609. This process allows the active component 604, the passive component 605, the wiring pattern 606 and 607 and the insulating substrate 608 to strongly adhere mechanically. The inner via 609 electrically connects the wiring patterns 606 and 607.

Then, the release film 603 is peeled from the sheet having a multilayered structure, so that a circuit component built-in module having a multilayered structure can be formed.

Thus, the above-described method allows a circuit component built-in module having a multilayered structure to be produced easily.

EXAMPLES

Hereinafter, the present invention will be specifically described by way of examples.

Example 1

In the production of a circuit component built-in module of the present invention, an example of a method for producing an insulating substrate formed of a mixture comprising an inorganic filler and a thermosetting resin will be described at first.

In this example, an insulating substrate was produced with a composition shown in Table 1. Sample 1 in Table 1 is a comparative example.

TABLE 1

| Sample No. | Inorganic filler | | Thermosetting resin | | | Heat conductivity (W/mK) | Linear expansion coefficient (ppm/° C.) | Dielectric constant 1 MHz | Dielectric loss 1 MHz (%) | Breakdown voltage (AC) kV/mm |
|---|---|---|---|---|---|---|---|---|---|---|
| | type | amount (wt %) | type | amount (wt %) | Additive (wt %) | | | | | |
| 1 | Al$_2$O$_3$ | 60 | liquid | 39.8 | carbon | 0.52 | 45 | 3.5 | 0.3 | 8.1 |
| 2 | Al$_2$O$_3$ | 70 | epoxy | 29.8 | black | 0.87 | 32 | 4.7 | 0.3 | 10.1 |
| 3 | Al$_2$O$_3$ | 80 | resin | 19.8 | (0.2) | 1.2 | 26 | 5.8 | 0.3 | 16.5 |
| 4 | Al$_2$O$_3$ | 85 | WE-2025 | 14.8 | | 2.8 | 21 | 6.1 | 0.2 | 15.5 |
| 5 | Al$_2$O$_3$ | 90 | | 9.8 | | 4.5 | 16 | 6.7 | 0.2 | 18.7 |
| 6 | Al$_2$O$_3$ | 95 | | 4.8 | | 5.5 | 11 | 7.1 | 0.2 | 17.1 |
| 7 | MgO | 78 | liquid | 21.8 | carbon | 4.2 | 24 | 8.1 | 0.4 | 15.2 |
| 8 | BN | 77 | epoxy | 22.8 | black | 5.5 | 10 | 6.8 | 0.3 | 17.4 |
| 9 | AlN | 85 | resin | 14.8 | (0.2) | 5.8 | 18 | 7.3 | 0.3 | 19.3 |
| 10 | SiO$_2$ | 75 | WE-2025 | 24.8 | | 2.2 | 7 | 3.5 | 0.2 | 18.2 |
| 11 | Al$_2$O$_3$ | 90 | phenol | 9.8 | carbon | 4.1 | 31 | 7.7 | 0.5 | 13.2 |

TABLE 1-continued

| | Inorganic filler | | Thermosetting resin | | | Heat | Linear expansion | Dielectric | Dielectric | Breakdown voltage |
|---|---|---|---|---|---|---|---|---|---|---|
| Sample No. | type | amount (wt %) | type | amount (wt %) | Additive (wt %) | conductivity (W/mK) | coefficient (ppm/° C.) | constant 1 MHz | loss 1 MHz (%) | (AC) kV/mm |
| 12 | Al$_2$O$_3$ | 90 | resin cyanate resin | 9.8 | black (0.2) dispersant (0.2) | 3.8 | 15 | 6.7 | 0.2 | 14.5 |

Note:
Liquid epoxy resin: WE-2025 manufactured by Nippon Pelnox Corporation
Phenol resin: Fenolight VH-4150 manufactured by Dainippon Ink and Chemicals, Inc.
Cyanate resin: AroCy, M-30 manufactured by Asahi Ciba
Carbon black: P-930 manufactured by Toyo Carbon
Dispersant: Prysurf S-208F manufactured by Dai-ich Kogyo Seiyaku Co., Ltd.
Al$_2$O$_3$: SA-40 manufactured by Showa Denko K. K.
SiO$_2$: primary reagent manufactured by Kanto Chemical Co., Inc.
AlN: manufactured by Dow Chemical Co. Ltd.
BN: manufactured by DENKI KAGAKU KOGYO K. K.
MgO: primary reagent manufactured by Kanto Chemical Co., Inc.

In this example, an epoxy resin manufactured by Nippon Pelnox (WE-2025, comprising an acid anhydrous hardening agent) was used for the liquid epoxy resin. A phenol resin manufactured by Dainippon Ink and Chemicals, Inc. (Fenolight, VH-4150) was used for the phenol resin. A cyanate resin manufactured by Asahi Ciba (AroCy, M-30) was used for the cyanate resin. In this example, carbon black or a dispersant was added as an additive.

A sheet mixture was produced in the following manner. First, a predetermined amount of a paste mixture obtained by mixing the components in the composition shown in Table 1 was poured and spread on a release film. The paste mixture was prepared by mixing an inorganic filler and a liquid thermosetting resin by an agitator for about 10 minutes. The agitator used in this example operates in such a manner that an inorganic filler and a liquid thermosetting resin are placed in a container, and the container itself rotates so as to stir the mixture in the container. The mixture obtained by using this agitator is dispersed sufficiently, even if the mixture has a relatively high viscosity. A polyethylene terephthalate film having a thickness of 75 μm was used for the release film, and the surface of the film was subjected to a release treatment with silicon.

Next, another release film was placed on the paste mixture on the release film, and pressing was performed by a pressurizing press so as to form a sheet mixture having a thickness of 500 μm.

Next, the sheet mixture sandwiched between the release films was heated together with the release films under the conditions that allow the elimination of the adhesion of the sheet mixture. The heat treatment was performed at 120° C. for 15 minutes. This heat treatment for eliminating the adhesion of the sheet mixture facilitates peeling of the release films. The liquid epoxy resin used in this example starts to be cured at 130° C., and therefore the epoxy resin was uncured (B stage) under the condition of this treatment.

Next, the release films were peeled from the sheet mixture, and the sheet mixture was sandwiched between heat resistant release films (PPS: polyphenylene sulfide, a thickness of 75 μm), and heated at a temperature of 170° C. for curing while being pressed at a pressure of 50 kg/cm$^2$.

Next, the heat resistant release films were peeled from the sheet mixture. Thus, an insulating substance was obtained.

After processing the insulating substrate into a predetermined size, the heat conductivity, the coefficient of linear expansion, the breakdown voltage, or the like were measured. The breakdown voltage of the insulating substrate indicates the adhesion between the inorganic filler and the thermosetting resin that are materials for the insulating substrate. More specifically, when the adhesion between the inorganic filler and the thermosetting resin is poor, micro gaps therebetween are formed so that the breakdown voltage deteriorates. Such micro gaps deteriorate the reliability of the circuit component built-in module. The heat conductivity was obtained in the following manner. A surface of a sample of 10 mm×10 mm was heated in contact with a heater, and an increase in the temperature on the other surface was measured. The heat conductivity was calculated based on the increase in the temperature on the other surface. The coefficient of linear expansion was obtained in the following manner. A change in the size of the insulating substrate was measured when the temperature was raised from room temperature to 140° C., and the coefficient of linear expansion was calculated based on the average value of the change. The breakdown voltage was obtained in the following manner. A breakdown voltage was calculated when an AC voltage was applied to the thickness direction of the insulating substrate, and a breakdown voltage per unit thickness was calculated.

As shown in Table 1, when Al$_2$O$_3$ was used for the inorganic filler, the insulating substrate produced according to the above-described method had more than about 10 times the heat conductivity of a conventional glass-epoxy substrate (0.2 w/mK to 0.3 w/mK). When the content of Al$_2$O$_3$ was about 85 wt % or more, the heat conductivity was 2.8 w/mK or more. A$_2$O$_3$ is also advantageous for reducing cost.

When AlN or MgO was used as the inorganic filler, the conductivity was as good as or better than that when Al$_2$O$_3$ was used.

When amorphous SiO$_2$ was used for the inorganic filler, the coefficient of linear expansion became closer to that of a silicon semiconductor (a coefficient of linear expansion of 3×10$^{-6}$/° C.). Therefore, the insulating substrate comprising amorphous SiO$_2$ as the inorganic filler is preferably used as a flip chip substrate directly on which a semiconductor is mounted.

Furthermore, when amorphous SiO$_2$ was used for the inorganic filler, an insulating substrate having a low dielectric constant was obtained. SiO$_2$ is advantageous in view of its low specific gravity. A circuit component built-in module comprising $SiO_2$ as the inorganic filler is preferably used as a high frequency module such as a cellular phone.

When BN was used for the inorganic filler, an insulating substrate having a high heat conductivity and a low coefficient of linear expansion was obtained.

As shown in Table 1, the breakdown voltages of the insulating substrates of all the samples except sample 1 (the comparative example), which comprises 60 wt % of $Al_2O_3$ as the inorganic filler, were 10 kV/mm or more. Generally, a breakdown voltage of 10 kV/mm or more can be translated to mean that the adhesion between the inorganic filler and the thermosetting resin is good. Therefore, it is preferable that the content of the inorganic filler is 70 wt % or more.

Furthermore, when the content of the thermosetting resin is low, the strength of the insulating substrate is low. Therefore, it is preferable that the content of the thermosetting resin is 4.8 wy % or more.

Example 2

An illustrative circuit component built-in module produced in the method described in Embodiment 2 will be described in this example.

The insulating substrate used in this example comprises 90 wt % of $Al_2O_3$(S-40 manufactured by Showa Denko K.K., spherical particles, an average particle diameter of 12 μm), 9.5 wt % of liquid epoxy resin (EF-450 manufactured by Nippon Rec Co. Ltd.), 0.2 wt % of carbon black (manufactured by Toyo Carbon) and 0.3 wt % of a coupling agent (46B, titanate based coupling agent manufactured by Ajinomoto Co., Inc.).

The materials for the insulating substrate were treated under the same conditions as those in Example 1, so as to produce a sheet having a thickness of 500 μm. The sheet was cut into a predetermined size, and through-holes of 0.15 mm diameter for inner-via-hole connection were formed by using a carbon dioxide gas laser (see FIG. 2(b)).

The through-holes were filled with a conductive resin composition by a screen printing method (see FIG. 2(c)). The conductive resin composition was obtained by mixing 85 wt % of spherical copper particles, 3 wt % of bisphenol A epoxy resin (Epicoat 828 manufactured by Yuka Shell Epoxy), 9 wt % of glycidyl ester based epoxy resin (YD-171 manufactured by Toto Kasei), and 3 wt % of amine adduct hardening agent (MY-24 manufactured by Ajinomoto Co., Inc.).

Next, one surface of a copper foil having a thickness of 35 μm was made rough, and a semiconductor device was flip-chip bonded onto the rough surface with a conductive adhesive (see FIG. 2(d)).

Then, the sheet with the through-holes filled with the conductive resin composition was sandwiched between the copper foil provided with a semiconductor device and another separately prepared copper foil having a thickness of 35 μm (one surface of which was made rough) in a suitable position (see FIG. 2(f)). The sheet was sandwiched between the copper foils so that the rough surfaces of the copper foils were in contact with the sheet.

Then, heating and pressing were performed by a hot-press at a temperature of 120° C. and a pressure of 10 kg/cm² for 5 minutes. Since the thermosetting resin in the sheet was softened by heating at a temperature below the curing temperature, the semiconductor device was easily buried in the sheet.

Then, the heating temperature was raised to 175° C., and heating was performed for 60 minutes (see FIG. 2(g)). This heating allowed the epoxy resin in the sheet and the epoxy resin in the conductive resin composition to be cured, so that the semiconductor device and the copper foils and the sheet were strongly connected mechanically. This heating also allowed the conductive resin composition and the copper foils to be connected electrically (through inner-via connection) and mechanically.

Then, the copper foil on the surface of the sheet in which the semiconductor device was buried was etched in a photolithography process and an etching process so as to form a wiring pattern (see FIG. 2(h)). Thus, a circuit component built-in module was produced.

In order to evaluate the reliability of the circuit component built-in module produced in this example, a solder reflow test and a temperature cycle test were conducted. The solder reflow test was conducted with a belt type reflow tester, in which a 10 second cycle was repeated 10 times at a maximum temperature of 260° C. The temperature cycle test was conducted by allowing the circuit component built-in module to stand at 125° C. for 30 minutes and then at −60° C. for 30 minutes per cycle, and repeating this cycle for a total of 200 cycles.

In either the solder reflow test or the temperature cycle test, no cracks were generated in the circuit component built-in module in this example, and abnormality was not recognized, even if a supersonic flaw detector was used. These tests confirmed that the semiconductor device and the insulating substrate adhered to each other tightly. A resistance value of the inner—via connection by the conductive resin composition was not substantially changed between measurements made before and after the tests.

Example 3

An illustrative circuit component built-in module produced in the method described in Embodiment 3 will be described in this example.

First, a sheet (500 μm thick) having through-holes filled with a conductive resin composition was produced in the same method as that in Example 2 (see FIG. 3(c)).

Next, a copper foil having a thickness of 35 μm was adhered to a release film (formed of polyphenylene sulfide and 150 μm thick) with an adhesive. One surface of the copper foil was rough, and the other smooth surface of the copper foil was adhered to the release film.

Then, the copper foil on the release film was etched in a photolithography process and an etching process so as to form a wiring pattern. Furthermore, a semiconductor device was flip-chip bonded onto the wiring pattern with a solder bump (see FIG. 3(d)).

Then, a sealing resin was injected in a gap between the wiring pattern and the semiconductor device on the wiring pattern. More specifically, a hot plate heated to 70° C. was tilted, and the release film having the wiring pattern provided with the semiconductor device was placed on the hot plate. Thereafter, a sealing resin was gradually injected between the semiconductor device and the wiring pattern with an injection. The injection of the sealing resin between the semiconductor device and the wiring pattern was completed in about 10 seconds. The hot plate was heated for the purpose of lowering the viscosity of the sealing resin so that the injection was completed in a short time. The hot plate was tilted for the purpose of facilitating the injection. As for the sealing resin, a product manufactured by Techno alpha Co. Ltd., EL18B, was used. The product, EL18B, is a resin comprising one-component epoxy resin mixed with $SiO_2$ powders.

On the other hand, in parallel to the above-described process, a release film (formed of polyphenylene sulfide and 150 μm thick) having a wiring pattern formed on one surface thereof was produced (see FIG. 3(e)).

Next, the sheet having the through-holes filled with the conductive resin composition was sandwiched between the release film with the semiconductor device bonded thereon and the release film having the wiring pattern on one surface thereof in a suitable position (see FIG. 3(f)).

Then, heating and pressing were performed by a hot-press at a temperature of 120° C. and a pressure of 10 kg/cm² for 5 minutes. Since the thermosetting resin in the sheet was softened by heating at a temperature below the curing temperature, the semiconductor device and the wiring pattern were easily buried in the sheet.

Then, the heating temperature was raised to 175° C., and heating was performed for 60 minutes (see FIG. 3(g)). This heating allowed the epoxy resin in the sheet and the conductive resin composition to be cured, so that the semiconductor device and the wiring pattern and sheet were strongly connected mechanically. This heating also allowed the conductive resin composition and the wiring pattern to be connected electrically (through inner-via connection) and mechanically. Furthermore, this heating allowed the sealing resin injected between the semiconductor device and the wiring pattern to be cured.

Then, the release film was peeled from the sheet (see FIG. 3(h)). The release film made of polyphenylene sulfide has a heat resistance against the above-mentioned heating temperature or more. Furthermore, the rough surface of the copper foil was adhered to the sheet and the inner via, and the smooth surface of the copper foil was adhered to the release film. Therefore, the adhesion between the sheet and the inner via and the copper foil was larger than that between the release film and the copper foil. This allowed the release film alone to be peeled off. Thus, a circuit component built-in module was produced.

In order to evaluate the reliability of the circuit component built-in module produced in this example, a solder reflow test and a temperature cycle test were conducted under the same conditions as those in Example 2.

In either the solder reflow test or the temperature cycle test, no cracks were generated in the circuit component built-in module in this example, and abnormality was not recognized, even if a supersonic flaw detector was used. These tests confirmed that the semiconductor device and the insulating substrate adhered to each other tightly. A resistance value of the inner—via connection by the conductive resin composition was not substantially changed between measurements made before and after the tests.

Example 4

An illustrative circuit component built-in module having a multilayered structure produced in the method described in Embodiment 5 will be described in this example.

In Example 4, a semiconductor device and a chip component were used as the circuit components.

First, a sheet having through-holes filled with a conductive resin composition was formed in the same manner as in Example 2.

Next, the sheet having through-holes filled with a conductive resin composition was positioned and superimposed on a release film (made of polyphenylene sulfide) provided with a wiring pattern having a circuit component flip-chip bonded thereon (see FIG. 5(a)).

Then, heating and pressing were performed by a hot-press at a temperature of 120° C. and a pressure of 10 kg/cm² for 5 minutes. Since the thermosetting resin in the sheet was softened by heating at a temperature below the curing temperature, the circuit component was easily buried in the sheet. Then, the release film was peeled from the sheet so as to form a sheet in which the circuit component was buried (see FIG. 5(b)).

A plurality of sheets were prepared in this manner, and the plurality of sheets and a copper foil were positioned and superimposed on one another (FIG. 5(g)).

Then, heating and pressing were performed by a hot-press at a temperature of 175° C. and a pressure of 50 kg/cm² for 60 minutes. This heating and pressing treatment allowed the copper foil and the plurality of sheets in which circuit components were buried to be integrated, and thus one sheet was formed. The heating and pressing treatment allowed the epoxy resin in the sheet and the conductive resin composition to be cured, so that the circuit components and the wiring pattern and the sheet were strongly connected mechanically. The heating and pressing treatment also allowed the copper foil and the wiring pattern and the conductive resin composition to be connected electrically (through inner-via connection) and mechanically.

Then, the copper foil on the surface of the sheet in which the circuit components were buried was etched in a photolithography process and an etching process so as to form a wiring pattern (see FIG. 5(h)). Thus, a circuit component built-in module having a multilayered structure was produced.

In order to evaluate the reliability of the circuit component built-in module produced in this example, a solder reflow test and a temperature cycle test were conducted in the same conditions as in Example 2.

In either the solder reflow test or the temperature cycle test, no cracks were generated in the circuit component built-in module in this example, and abnormality was not recognized, even if a supersonic flaw detector was used. These tests confirmed that the semiconductor device and the insulating substrate adhered to each other tightly. A resistance value of the inner—via connection by the conductive resin composition was not substantially changed between measurements made before and after the tests.

Example 5

An illustrative circuit component built-in module having a multilayered structure produced in the method described in Embodiment 6 will be described in this example.

First, a sheet having through-holes filled with a conductive resin composition was formed in the same manner as in Example 2. Next, the sheet having through-holes filled with a conductive resin composition was positioned and superimposed on a release film (made of polyphenylene sulfide) provided with a wiring pattern having a circuit component flip-chip bonded thereon (see FIG. 6(a)).

Then, heating and pressing were performed by a hot-press at a temperature of 120° C. and a pressure of 10 kg/cm² for 5 minutes. Since the thermosetting resin in the sheet was softened by heating at a temperature below the curing temperature, the circuit component was easily buried in the sheet. The release film was peeled from the sheet so as to form a sheet (see FIG. 6(b)). Another sheet in which a circuit component was buried was formed in the same manner (see FIG. 6(d)).

Then, wiring patterns were formed on one surface of a release film made of polyphenylene sulfide (see FIG. 6(e)).

Then, the two sheets with the circuit components buried therein and the release film provided with the wiring patterns were positioned and superimposed on one another (see FIG. 6(f)).

Then, heating and pressing were performed by a hot-press at a temperature of 175° C. and a pressure of 50 kg/cm² for 60 minutes. This heating and pressing treatment allowed the release film and the plurality of sheets with the circuit components buried therein to be integrated, and thus one sheet was formed. The heating and pressing treatment allowed the epoxy resin in the sheet to be cured, so that the circuit components and the wiring pattern and the sheet were strongly connected mechanically. The heating and pressing treatment also allowed the epoxy resin in the conductive resin composition to be cured, so that the wiring pattern and the conductive resin composition were connected electrically (through inner-via connection) and mechanically.

Then, the release film was peeled from the integrated sheet so that a circuit component built-in module having a multilayered structure was produced (see FIG. 6(g)).

In order to evaluate the reliability of the circuit component built-in module produced in this example, a solder reflow test and a temperature cycle test were conducted in the same conditions as in Example 2.

In either the solder reflow test or the temperature cycle test, no cracks were generated in the circuit component built-in module in this example, and abnormality was not recognized, even if a supersonic flaw detector was used. These tests confirmed that the semiconductor device and the insulating substrate adhered to each other tightly. A resistance value of the inner—via connection by the conductive resin composition was not substantially changed between measurements made before and after the tests.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A circuit component built-in module comprising:
   an insulating substrate formed of a mixture comprising an inorganic filler and a thermosetting resin;
   a plurality of wiring patterns formed on at least one principal plane of the insulating substrate;
   an active component buried in the insulating substrate and electrically connected to at least one of the wiring patterns; and
   a passive component buried in the insulating substrate and electrically connected to at least one of the wiring patterns;
   wherein the active component is electrically connected to the passive component by the wiring patterns and the insulating substrate has a coefficient of linear expansion of $8\times10^{-6}$/° C. to $20\times10^{-6}$/° C. and a heat conductivity of 1 w/mK to 10 w/mK.

2. A circuit component built-in module according to claim 1, comprising an inner via formed in the insulating substrate and electrically connected to the wiring patterns.

3. A circuit component built-in module according to claim 2, wherein the inner via is formed of a conductive resin composition.

4. A circuit component built-in module according to claim 3, wherein the conductive resin composition comprises metal particles of at least one metal selected from the group consisting of gold, silver, copper and nickel as a conductive component, and an epoxy resin as a resin component.

5. A circuit component built-in module according to claim 1, wherein 70 wt % to 95 wt % of the mixture comprises the inorganic filler.

6. A circuit component built-in module according to claim 1, wherein the wiring patterns are formed on the principal plane and in an internal portion of the insulating substrate.

7. A circuit component built-in module according to claim 1, wherein the circuit component is shielded from external air by the insulating substrate.

8. A circuit component built-in module according to claim 1, wherein the thermosetting resin comprises at least one thermosetting resin selected from the group consisting of an epoxy resin, a phenol resin and a cyanate resin.

9. A circuit component built-in module according to claim 1, wherein the inorganic filler comprises at least one inorganic filler selected from the group consisting of $Al_2O_3$, MgO, BN, AlN and $SiO_2$.

10. A circuit component built-in module according to claim 1, wherein an average particle diameter of the inorganic filler is 0.1μm to 100μm.

11. A circuit component built-in module according to claim 1, wherein the wiring patterns comprise at least one conductive substance selected from the group consisting of copper and a conductive resin composition.

12. A circuit component built-in module according to claim 1, wherein the wiring patterns comprise lead frames formed by etching or stamping.

13. A circuit component built-in module according to claim 1, wherein the circuit component comprises at least one component selected from the group consisting of a chip resistor, a chip capacitor and a chip inductor.

14. A circuit component built-in module according to claim 1, wherein the mixture further comprises at least one additive selected from the group consisting of a dispersant, a coloring agent, a coupling agent and a releasing agent.

15. A circuit component built-in module according to claim 1, wherein the active component comprises a semiconductor bare chip, and the semiconductor bare chip is flip-chip bonded onto the wiring pattern.

16. A circuit component built-in module according to claim 1, wherein the wiring patterns comprise a conductive resin composition and the conductive resin composition comprises metal particles of at least one metal selected from the group consisting of gold, silver, copper and nickel as a conductive component, and an epoxy resin as a resin component.

* * * * *